United States Patent
Lee (10) Patent No.: US 6,692,275 B2
(45) Date of Patent: Feb. 17, 2004

(54) APPARATUS FOR GUIDING FLEXIBLE PRINTED CIRCUIT BOARD AND CELLULAR PHONE HAVING THE SAME

(75) Inventor: Byoung-Gon Lee, Seoul (KR)

(73) Assignee: Curitel Communications, Inc., Kyoungki-do (KR)

( * ) Notice: Subject to any disclaimer, the term of this patent is extended or adjusted under 35 U.S.C. 154(b) by 0 days.

(21) Appl. No.: 10/334,554

(22) Filed: Dec. 30, 2002

(65) Prior Publication Data

US 2004/0002241 A1 Jan. 1, 2004

(30) Foreign Application Priority Data

Jun. 29, 2002 (KR) .......................................... 2002-37567

(51) Int. Cl.[7] ................................................ H01R 3/00
(52) U.S. Cl. ......................................... 439/165; 439/13
(58) Field of Search ................................. 439/165, 164, 439/162, 31, 65, 59, 60, 61, 446, 67, 492; 361/679, 681, 683

(56) References Cited

U.S. PATENT DOCUMENTS

| | | | | |
|---|---|---|---|---|
| 4,986,763 A | * | 1/1991 | Boyle | 439/165 |
| 5,278,725 A | * | 1/1994 | Konno et al. | 361/680 |
| 5,390,075 A | * | 2/1995 | English et al. | 361/683 |
| 5,581,440 A | * | 12/1996 | Toedter | 361/683 |
| 5,681,763 A | * | 10/1997 | Ham et al. | 438/309 |
| 5,751,544 A | * | 5/1998 | Song | 361/681 |
| 5,951,312 A | * | 9/1999 | Horng | 439/165 |
| 5,995,373 A | * | 11/1999 | Nagai | 361/755 |
| 6,352,434 B1 | * | 3/2002 | Emmert | 439/65 |
| 6,447,314 B1 | * | 9/2002 | Kato et al. | 439/165 |
| 6,547,575 B2 | * | 4/2003 | Kato et al. | 439/165 |
| 6,616,467 B2 | * | 9/2003 | Ibaraki et al. | 439/165 |

* cited by examiner

Primary Examiner—P. Austin Bradley
Assistant Examiner—Phuongchi Nguyen
(74) Attorney, Agent, or Firm—Blakely, Sokoloff, Taylor & Zafman (57) ABSTRACT

Provided is an apparatus for guiding a flexible printed circuit board that electrically connects the main body and the liquid crystal display (LCD) unit of a mobile terminal that protects the FPCB from damages, cushions the switching force caused by the hinge unit, and stops the LCD unit at an arbitrary angle, thus improving the product reliability. The guiding apparatus includes: a body corresponding to the inner diametral shape of a guide case of the liquid crystal display unit, in which the hinge is formed; a guiding groove that is formed to a predetermined length in the axial direction from one end of the body; a pair of guide protrusions that are extended from the circumferential portion of the other end of the body in the axial direction with a predetermined width and facing to each other; and a pair of connection protrusions that are extended from the circumferential portion of the other end of the body in parallel with the guiding groove and facing to each other.

13 Claims, 9 Drawing Sheets

APPARATUS FOR GUIDING FLEXIBLE PRINTED CIRCUIT BOARD AND CELLULAR PHONE HAVING THE SAME

FIELD OF THE INVENTION

The present invention relates to an apparatus for guiding a flexible printed circuit board (FPCB), which connects a main body and a liquid crystal display (LCD) unit of a mobile terminal electrically; and, more particularly, to a guiding apparatus for guiding a FPCB that can protect the FPCB from damages caused by frequent contacts, absorb the switching impact caused by a hinge, and stop the LCD unit at a predetermined angle.

DESCRIPTION OF RELATED ART

Generally, a mobile terminal incorporates a main body provided with a battery (not shown), a keypad including such input keys as number buttons, a power button and function buttons, a printed circuit board (PCB)(not shown) inside for transforming the input signals of the keypad into signals, and a mike in the bottom portion; a liquid crystal display (LCD) unit provided with a speaker (not shown) at the top portion and an LCD screen for displaying the data inputted from the keypad of the main body; and a hinge unit for connecting the main body and the LCD unit and folding and unfolding them smoothly. The PCB of the main body and the LCD screen of the LCD unit are connected by a flexible printed circuit board (FPCB) electrically.

Figure 1:
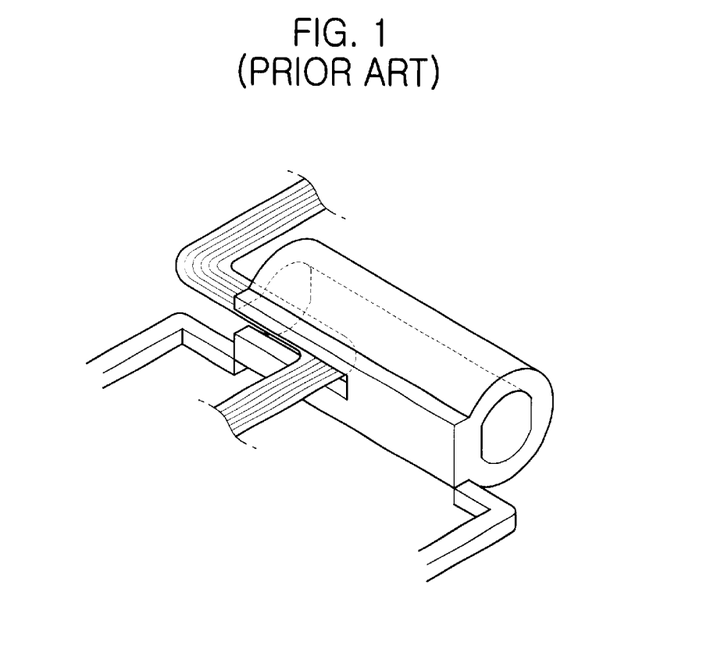
FIG. 1 is a perspective view showing part of a main body of a mobile terminal, provided with a guide case according to a prior art.
Figure 2:
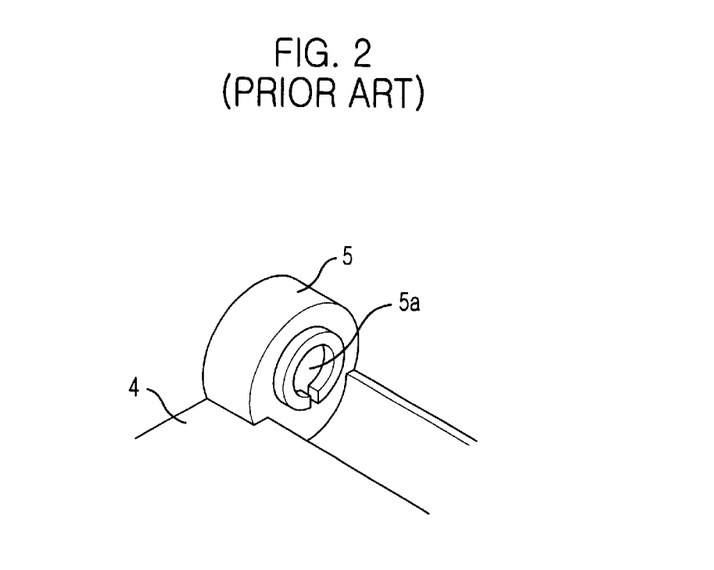
FIG. 2 is a perspective view illustrating part of a liquid crystal display (LCD) unit connected with the guide case of the main body according to a prior art.

The structure of a conventional FPCB for connecting the main body and the LCD unit is described herein, with respect to FIGS. 1 and 2.

FIG. 1 is a perspective view showing part of a main body of a conventional mobile terminal provided with a guide case, and FIG. 2 is a perspective view illustrating part of an LCD unit connected with the guide case of the main body.

As illustrated in the drawings, the conventional FPCB guide has a guiding hole 2a formed in the guide case 2 of the LCD unit 1, where the hinge unit (not shown) is formed, in the direction of the guide case length. The FPCB 3 coming out from the LCD unit 1 is connected to the PCB of the main body 4 through a connection hole 5a formed in the cylindrical connector connected with one end of the guide case 2 at one side of the main body 4.

The conventional FPCB guide, however, causes unintentional winding or twists in guiding the FPCB and it may make cracks at the corner of the FPCB. In addition, it can cause noise or short circuit due to the interference between the FPCB and the FPCB guide case, thereby dropping product reliability.

Also, the conventional FPCB guide has a problem that it cannot absorb the impact supplied to the main body or the LCD unit of a mobile terminal when it is folded and unfolded. It also has a shortcoming that it cannot maintain the LCD unit at an arbitrary angle freely.

SUMMARY OF THE INVENTION

It is, therefore, an object of the present invention to provide an apparatus for guiding a flexible printed circuit board (FPCB) of a mobile terminal that can cushion the switching force caused by a hinge and stop the LCD unit at an arbitrary angle, as well as improve the product reliability by preventing the FPCB from any damage.

In accordance with an aspect of the present invention, there is provided an apparatus for guiding a flexible printed circuit board that electrically connects the main body and the liquid crystal display unit of a mobile terminal, which are connected by a hinge, comprising: a body corresponding to the inner diametral shape of a guide case of the liquid crystal display unit, in which the hinge is formed; a guiding groove that is formed to a predetermined length in the axial direction from one end of the body; a pair of guide protrusions that are extended from the circumferential portion of the other end of the body in the axial direction with a predetermined width and facing to each other; and a pair of connection protrusions that are extended from the circumferential portion of the other end of the body in parallel with the guiding groove and facing to each other.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 3:
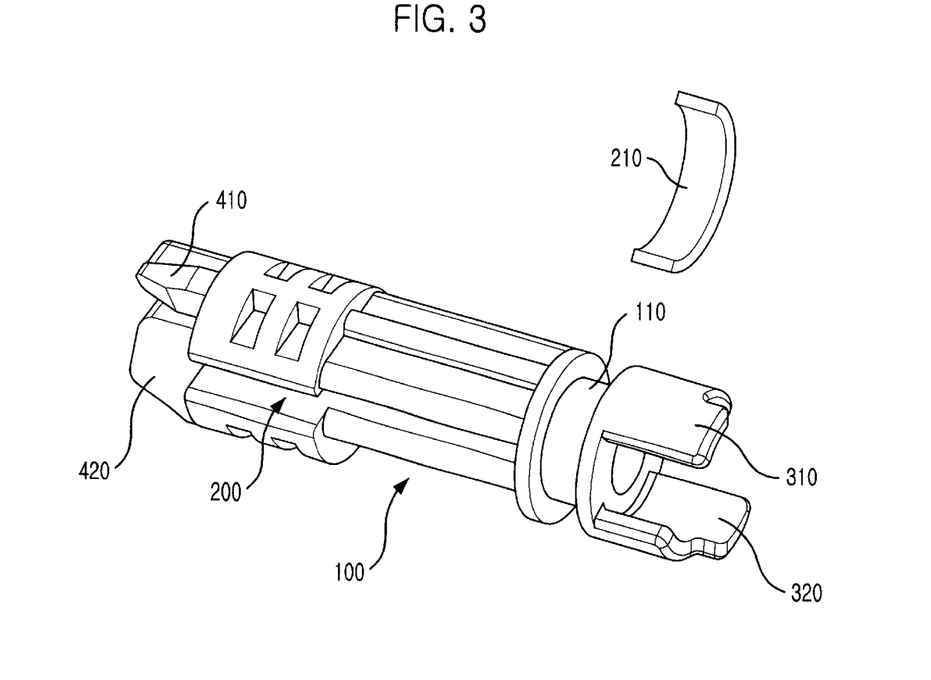
FIG. 3 is a perspective view describing an apparatus for guiding a flexible printed circuit board (FPCB) in accordance with an embodiment of the present invention.
Figure 4:
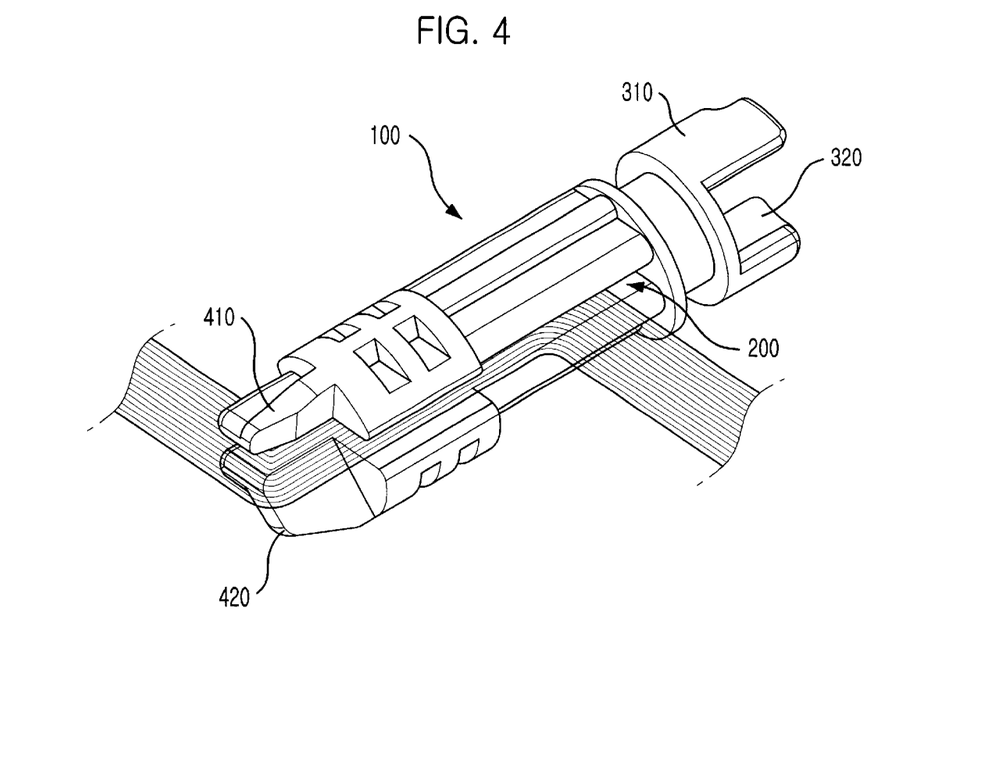
FIG. 4 is a perspective view showing how the FPCB is guided in the guiding apparatus in accordance with an embodiment of the present invention.
Figure 5:
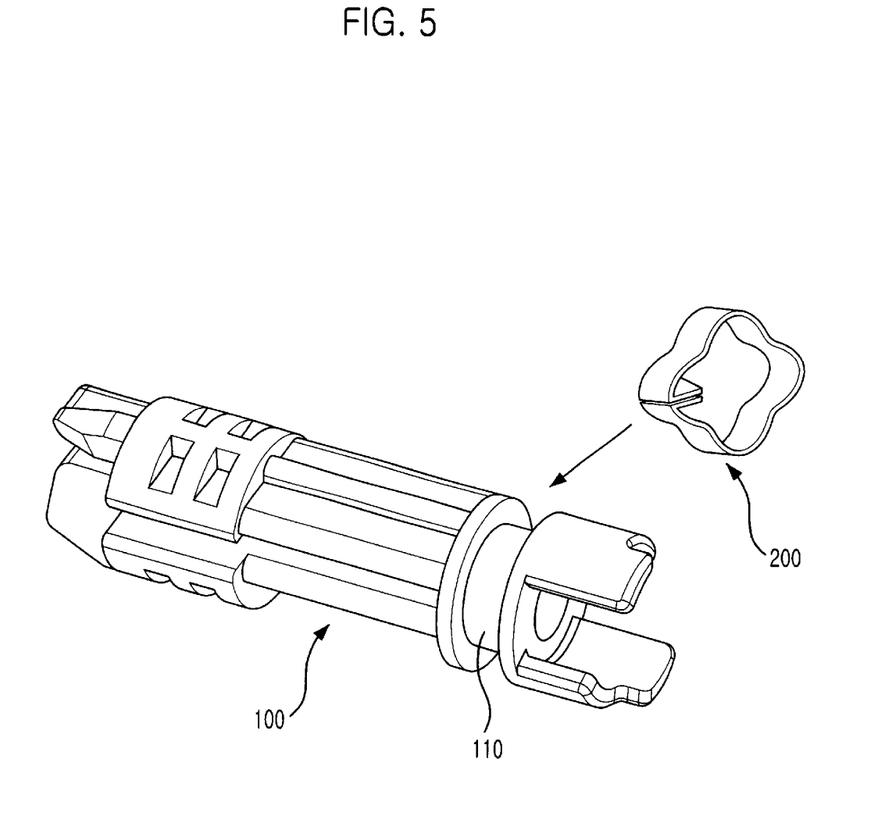
FIG. 5 is a perspective view illustrating the guiding apparatus provided with a frictional force generating means in accordance with another embodiment of the present invention.
Figure 6:
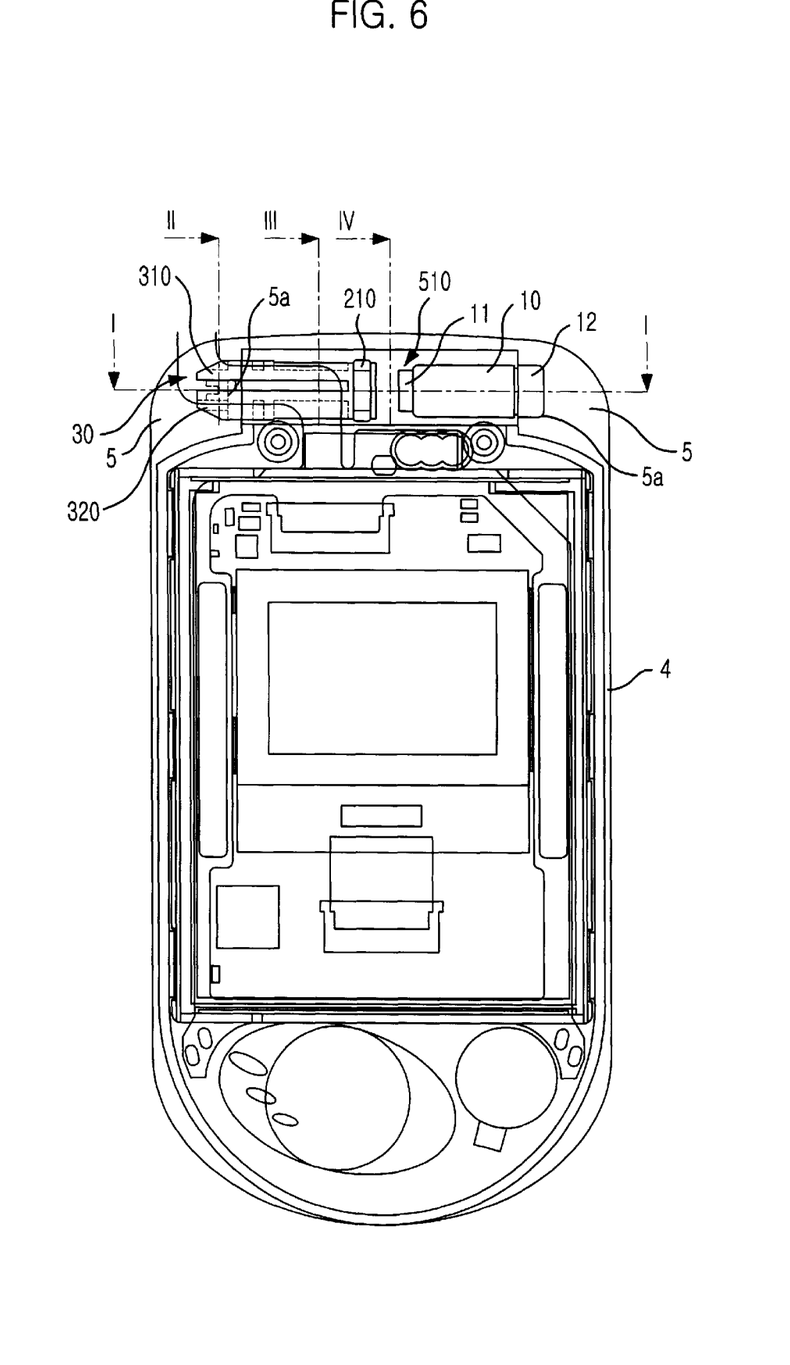
FIG. 6 is a plane figure describing the internal structure of a mobile terminal using the guiding apparatus of the present invention.
Figure 7:
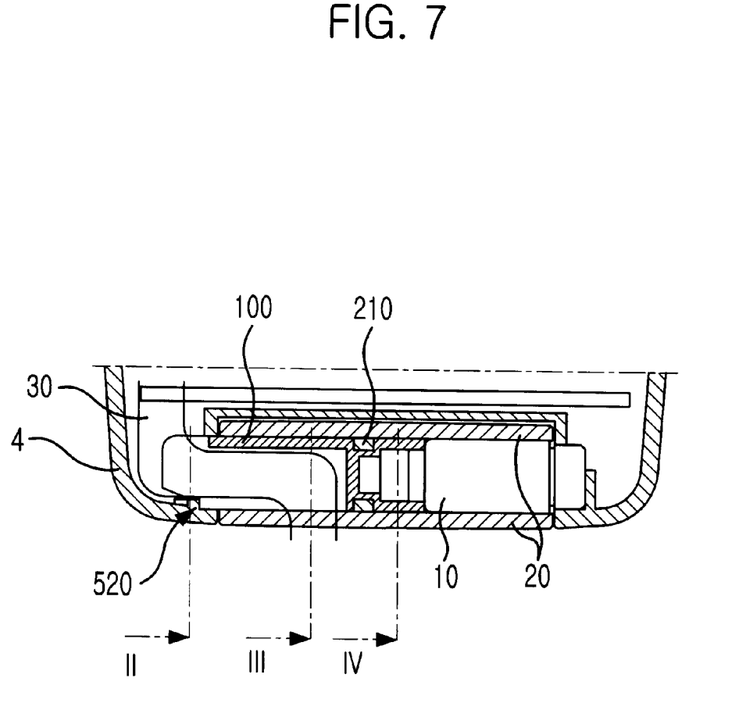
FIG. 7 is a front view showing the mobile terminal of FIG. 6, cut along the line I—I.
Figure 8:
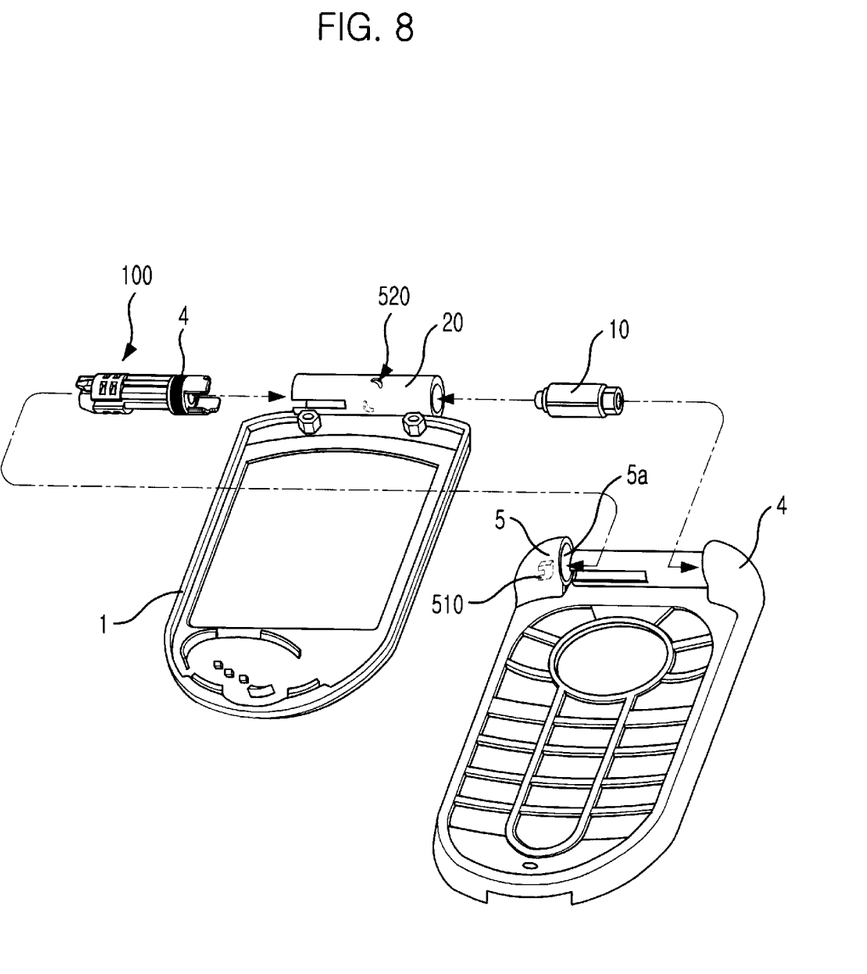
FIG. 8 is a disassembled perspective view describing the process of mounting the guiding apparatus on the mobile terminal in accordance with the present invention.

FIG. 3 is a perspective view describing an apparatus for guiding a flexible printed circuit board (FPCB) in accordance with an embodiment of the present invention, and FIG. 4 is a perspective view showing how the FPCB is guided in the guiding apparatus in accordance with an embodiment of the present invention. FIG. 5 is a perspective view illustrating the guiding apparatus provided with a frictional force generating means in accordance with another embodiment of the present invention, and FIG. 6 is a plane figure describing the internal structure of a mobile terminal using the guiding apparatus of the present invention. FIG. 7 is a front view showing the mobile terminal of FIG. 6, cut along the line I—I, and FIG. 8 is a disassembled perspective view describing the process of mounting the guiding apparatus on the mobile terminal in accordance with the present invention.

As shown in the drawing, the guiding apparatus for guiding a FPCB is provided to the guide case 20 of the liquid crystal display (LCD) unit, where a hinge 10 is formed. The guiding apparatus includes: a cylindrical body 100 having a diameter close to the internal diameter of the guide case 20 of the LCD unit, where the hinge 10 is formed; a guiding groove 200 that is formed to a predetermined length in the axial direction from one end of the body 100, for guiding the FPCB 30; guide protrusions 310 and 320 that are extended from the circumferential portion of the other end of the body in the axial direction with a predetermined width and facing to each other; connection protrusions 410 and 420 that are extended from the circumferential portion of the other end of the body in parallel with the guiding groove 200 and facing to each other. Here, the guide protrusions 310 and 320 are connected to one end 11 of the hinge unit 10, as illustrated in FIGS. 6 and 8.

The connection protrusions 410 and 420 are connected rotatably to a connection hole 5a formed in the connector 5 at one end of the main body 4. It is desirable to form the guide protrusions 310 and 320 on the body 100 at a location moved at a predetermined angle clockwise from the location where the connection protrusions 410 and 420 are formed.

The guiding apparatus further includes a frictional force generation means formed on the outer circumferential surface of the guiding apparatus, for contacting the inner side of the guide case 20 of the LCD unit 1 and generating a frictional force. The frictional force generation means is formed of a resin, rubber or synthetic leather circular or semi-circular fraction material 210. The frictional force generation means is mounted on the outer circumference at one side of the body 100, desirably on the circular groove 110 formed on the outer circumference at one side of the body 100, as shown in FIGS. 3 and 4.

In accordance with another preferred embodiment of the present invention, as illustrated in FIG. 5, a circular plate spring friction material 220 having a break-off can be provided to the circular groove 110, which is formed on the outer circumference at one side of the body 100.

The distance between the center of the circular plate spring 220 having a break-off and the valley portion is desirably the same as the distance between the central axis of the body 100 and the outer circumference of the circular groove 110. The distance between the center of the circular plate spring and the top portion is desirably longer than the distance between the central axis of the body 100 and the outer circumference of the body 100.

Meanwhile, the guiding apparatus of the present invention further includes a stopping means that can be rotated to a predetermined angle along with the guide case of the LCD unit and stop the rotation.

Referring to FIGS. 6 and 7, the stopping means includes a first stopper 510 which is formed on the inside of the connection hole 5a in the connector 5 of the main body 4, to which the connection protrusions 410 and 420 of the body 100 are connected, and protruded at a predetermined angle from the confronting face of the connection protrusions 410 and 420.

Here, the angle between the first stopper 510 and the confronting surface of the connection protrusions 410 and 420 may be 30–45° when the LCD unit 1 and the main body 4 are folded. Here, the desirable angle is 40°. That is, when one side of the connection protrusion 410 contacts one side of the first stopper 510, the desirable angle between the other side of the connection protrusion 410 and the other side of the first stopper 510 is 80°.

Referring to FIGS. 7 and 8, the stopping means further includes a second stopper 520 which is formed on the inside of the guide case 20 of the LCD unit 1, where the guide protrusions 310 and 320 of the body 100 are positioned, and protruded at a predetermined angle from the confronting surface of the guide protrusions 310 and 320.

The FPCB guiding apparatus of the present invention is assembled as described in FIGS. 6 to 8. First, the body 100 of the guiding apparatus and the hinge unit 10 are put into the guide case 2 of the LCD unit 1 through the holes in the right and left side of the guide case 2. Then, the FPCB 30 connected with the LCD screen is inserted to the guiding groove 200 of the body 100.

Subsequently, the body 100 of the guiding apparatus is put from the left to the right so as to connect the guide protrusions 310 and 320 of the body with one end 11 of the hinge unit 10 and thus move the hinge unit 10 to the right side. Then, the connection protrusions 410 and 420 of the body 100 are fitted into the connection hole 5a of the connector 5 at one side of the main body 4 while pushing the hinge unit 10 to the left to put the connection protrusions 410 and 420 into the connection hole 5a. When the hinge unit 10 is pushed, the other side 12 of the hinge unit 10 gets fitted in the connection hole 5a of the connector 5 on the other side of the main body 4 by a spring (not shown) in the hinge unit 10. Here, the other side 12 of the hinge unit 10 is within the guide case 20.

The other side 12 of the hinge unit 10 fitted into the connection hole 5a is moved by the restitution force of the spring in the hinge unit 10, and inserted to the connection hole 5a on the other side of the main body 4, thus completing the assembly of the guide apparatus.

Referring to FIGS. 9A to 9C, and 10A to 10C, the operation of the FPCB guiding apparatus is described herein.

Figure 9A:
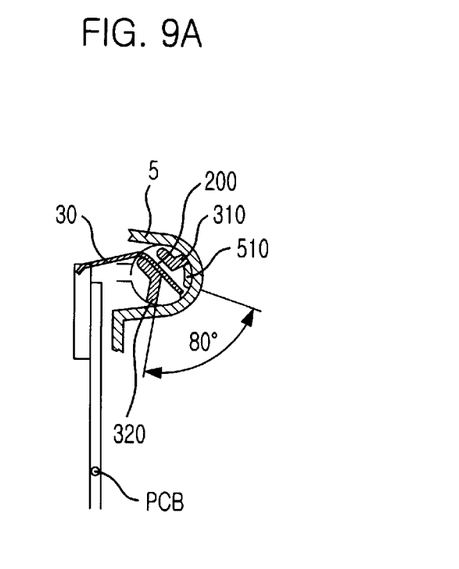
FIGS. 9A to 9C are cross-sectional views showing the sides of the main body folded with the LCD unit, which are cut along the lines II—II, III—III and IV—IV in the mobile terminal of FIGS. 6 and 7, respectively.
Figure 9B:
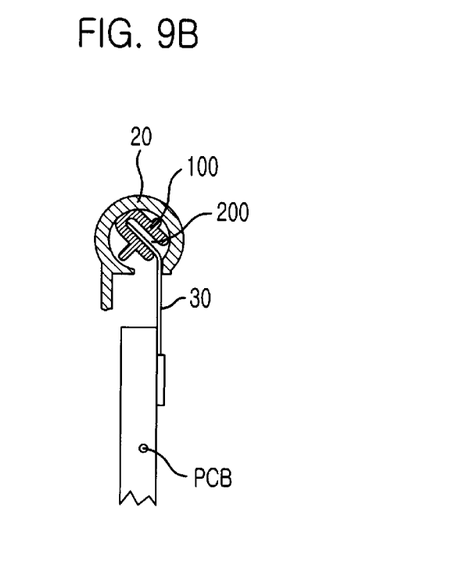
Figure 9C:
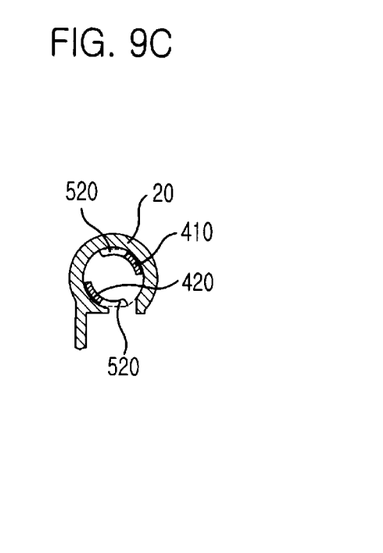
Figure 10A:
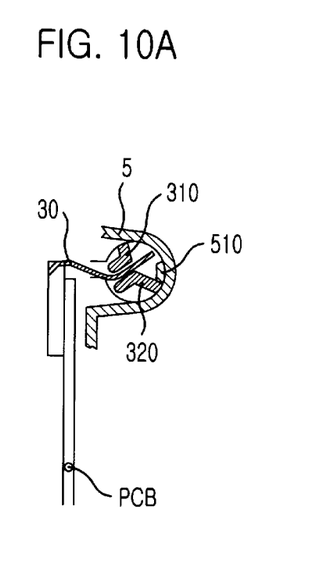
FIGS. 10A to 10C are cross-sectional views showing the sides of the main body unfolded from the LCD unit, which are cut along the lines II—II, III—III and IV—IV in the mobile terminal of FIGS. 6 and 7, respectively.
Figure 10B:
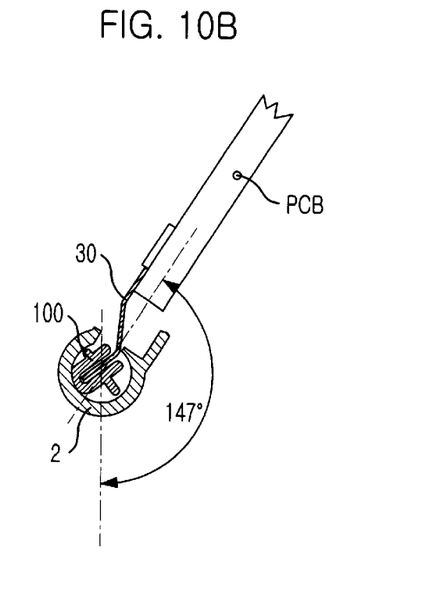
Figure 10C:
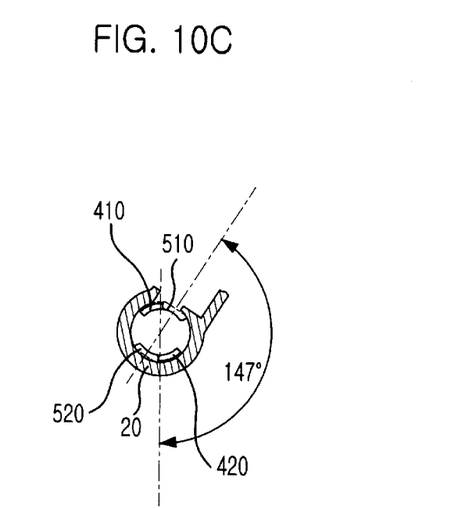

FIGS. 9A to 9C are cross-sectional views showing the sides of the main body folded up with the LCD unit, which are cut along the lines II—II, III—III and IV—IV in the mobile terminal of FIGS. 6 and 7, respectively; and FIGS. 10A to 10C are cross-sectional views showing the sides of the main body unfolded from the LCD unit, which are cut along the lines II—II, III—III and IV—IV in the mobile terminal of FIGS. 6 and 7, respectively.

As illustrated in the drawings, first, when the LCD unit 1 and the main body 4 are folded, the FPCB 30 connected with the PCB of the main body 1 is connected to the LCD screen of the LCD unit 1 through the guiding groove 200 of the body 100. Here, the connection protrusion 420 on one side of the body 100 and the stopper 510 are at a predetermined angle, which is 80° in the drawing.

When the LCD unit 1 is unfolded, the body 100 formed inside the guide case 20 of the LCD unit 1 is rotated. Here, the friction material 210 formed on the outer circumferential surface of the body 100 frictionizes the inner surface of the guide case 20. While the LCD unit 1 is rotated, the FPCB 30 is guided through the guiding groove 200 of the body 100, not generating interference or twists.

When the body 100 is rotated to a predetermined angle, the connection protrusion 420 on one side of the body 100 contacts one side of the first stopper 510 formed on the connection hole 5a in the connector 5 of the main body 4 and stops the rotation. Then, the body 100 stops and the LCD unit 1 remains open by the operation of the hinge unit 10.

Here, the LCD unit 1 is unfolded smoothly due to the frictional force between the friction material 210 and the inner surface of the guide case 20. The unfolding operation is completed, when the second stopper 520 of the guide case 20 contacts the guide protrusion 310 at one side of the body 100.

To the contrary, when the unfolded LCD unit 1 is folded, the body 100 formed in the guide case 20 of the LCD unit 1 is rotated, and the friction material 210 on the outer circumferential surface frictionizes the inner surface of the guide case 20. When the body 100 is rotated to a predetermined angle, the connection protrusion 410 at one side of the body 100 contacts the other side of the first stopper 510 formed in the connection hole of the connector 5 to thereby stop the rotation of the body 100.

The body 100 stops the operation, and the LCD unit 1 remains folded by the operation of the hinge unit 10. Here, the LCD unit 1 is folded smoothly due to the frictional force between the friction material 210 and the inner surface of the guide case 20. The folding operation is completed, when the second stopper 520 of the guide case 20 contacts the guide protrusion 320 at the other side of the body 100.

Therefore, the apparatus of the present invention prevents interference on the FPCB and absorbs impact supplied to the main body or the LCD unit of a mobile terminal by operating them smoothly, when the LCD unit is unfolded or folded.

Meanwhile, in the guiding apparatus of the present invention, when the circular plate spring having a break-off is used as a friction material 220, as shown in FIG. 5, it is possible to stop the LCD unit 1 at an arbitrary angle, because the guide case 20 of the LCD unit 1 contacts the top portion of the friction material, i.e., plate spring, and generates a frictional force, when it is rotated in the folding and unfolding operation of the LCD unit 1.

As described above, the guiding apparatus of the present invention protects the FPCB from damages, absorbs the switching impact caused by the hinge unit, and stops the LCD unit at an arbitrary angle, thus improving the product reliability.

While the present invention has been described with respect to certain preferred embodiments, it will be apparent to those skilled in the art that various changes and modifications may be made without departing from the scope of the invention as defined in the following claims.

What is claimed is:

1. An apparatus for guiding a flexible printed circuit board that electrically connects a main body and a liquid crystal display unit of a mobile terminal, which are connected by a hinge, comprising:
    a body corresponding to the inner diametral shape of a guide case of the liquid crystal display unit, in which the hinge is formed;
    a guiding groove that is formed in the axial direction from one end of the body and has a predetermined length;
    a pair of guide protrusions that are extended from the circumferential portion of the other end of the body in the axial direction with a predetermined width and facing to each other; and
    a pair of connection protrusions that are extended from the circumferential portion of the other end of the body in parallel with the guiding groove and facing to each other.

2. The apparatus as recited in claim 1, wherein the body has a diameter close to the inner diameter of the guide case of the liquid crystal display unit, in which the hinge is formed.

3. The apparatus as recited in claim 1, wherein the guide protrusions are formed on the body at a location moved for a predetermined angle clockwise from the location where the connection protrusions are formed.

4. The apparatus as recited in claim 1, further including a stopping means formed on the body or the liquid crystal display unit for stopping the rotation of the body.

5. The apparatus as recited in claim 4, wherein the stopping means includes a first stopper which is formed on the inside of the connection hole in the cylindrical connector formed on one side of the main body, to which the connection protrusions of the body are connected, and protruded at a predetermined angle from the confronting face of the connection protrusions.

6. The apparatus as recited in claim 5, wherein the angle between the first stopper and the confronting surface of the connection protrusions is 30~45°, when the liquid crystal display unit and the main body are folded up.

7. The apparatus as recited in claim 5, wherein when one side of the connection protrusion contacts one side of the first stopper, the angle between the other side of the connection protrusion and the other side of the first stopper is 80°.

8. The apparatus as recited in claim 4, wherein the stopping means further includes a second stopper which is formed on the inside of the guide case of the liquid crystal display unit, where the guide protrusions of the body are positioned, and protruded at a predetermined angle from the confronting surface of the guide protrusions.

9. The apparatus as recited in claim 1, further comprising:
    a frictional force generation means formed on the outer circumferential surface of the body, for contacting the inner side of the guide case of the liquid crystal unit and generating a frictional force.

10. The apparatus as recited in claim 9, wherein the frictional force generation means is formed of a circular or a semi-circular friction material.

11. The apparatus as recited in claim 10, wherein the friction material is mounted on a circular groove formed on the outer circumferential surface at one side of the body.

12. The apparatus as recited in claim 9, wherein the frictional force generation means is formed of a circular plate spring having a break-off, which is used as a friction material, and mounted on a circular groove formed on the outer circumferential surface at one side of the body.

13. The apparatus as recited in claim 12, wherein in the circular plate spring having a break-off, the distance between the center of the circular plate spring and the valley portion is the same as the distance between the central axis of the body and the outer circumference of the circular groove, and the distance between the center of the circular plate spring and the top portion is longer than the distance between the central axis of the body 100 and the outer circumference of the body.

* * * * *